(12) United States Patent
Otsubo

(10) Patent No.: US 7,564,883 B2
(45) Date of Patent: Jul. 21, 2009

(54) OPTICAL SEMICONDUCTOR DEVICE AND METHOD FOR FABRICATING THE SAME

(75) Inventor: Koji Otsubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 345 days.

(21) Appl. No.: 11/020,214

(22) Filed: Dec. 27, 2004

(65) Prior Publication Data

US 2005/0271103 A1    Dec. 8, 2005

(30) Foreign Application Priority Data

Jun. 7, 2004    (JP) .............................. 2004-168099

(51) Int. Cl.
*H01S 3/098* (2006.01)
*H01S 5/00* (2006.01)

(52) U.S. Cl. .................... 372/45.01; 372/19; 372/46.01

(58) Field of Classification Search .................. 372/19, 372/45.01, 46.01
See application file for complete search history.

(56) References Cited

U.S. PATENT DOCUMENTS 6,522,676 B1 * 2/2003 Goto et al. ............... 372/43.01
6,625,190 B1 * 9/2003 Hayakawa et al. ........ 372/45.01
6,925,101 B2 * 8/2005 Matsumura ............... 372/46.01
2002/0114367 A1 * 8/2002 Stintz et al. ................... 372/45
2003/0128729 A1 * 7/2003 Matsumura .................. 372/46

FOREIGN PATENT DOCUMENTS

| JP | 02-178989 | 7/1990 |
| JP | 08-255932 | 10/1996 |
| JP | 10-178200 | 6/1998 |
| JP | 2001-127333 | 5/2001 |

* cited by examiner

*Primary Examiner*—Kenneth A Parker
*Assistant Examiner*—Hrayr A Sayadian
(74) *Attorney, Agent, or Firm*—Kratz, Quintos & Hanson, LLP

(57) ABSTRACT

The optical semiconductor device comprises a lower clad layer 12, optical waveguide layers 14, 16, 18 including an active layer for recombining the carriers. The upper clad layer 20 is mesa stripe configuration having a first mesa portion contacting the contact layer 22 and having a first width, and a second mesa portion having a second width larger than the first width. The first width, the second width and the thickness of the second mesa portion are set not to oscillate in the higher-order transverse mode.

7 Claims, 9 Drawing Sheets

OPTICAL SEMICONDUCTOR DEVICE AND METHOD FOR FABRICATING THE SAME

CROSS-REFERENCE TO RELATED APPLICATIONS

This application is based upon and claims the benefit of priority from the prior Japanese Patent Application No. 2004-168099, filed on Jun. 7, 2004, the entire contents of which are incorporated herein by reference.

BACKGROUND OF THE INVENTION

The present invention relates to an optical semiconductor device and a method for fabricating the same, more specifically an optical semiconductor device having a ridge waveguide structure and a method for fabricating the same.

As semiconductor lasers for the high speed optical communication are known the buried-heterostructure (BH) and the ridge structure.

The buried-heterostructure includes an active layer buried in a material of different refractive index to thereby confine light in the active layer by the refractive index difference. The buried-heterostructure can have low threshold oscillation and single-transverse-mode by confining current and light in micronized regions in both the vertical and the transverse directions.

On the other hand, the ridge structure has a simple structure including a mesa stripe of a clad layer formed on an active layer, and the structure for narrowing the current and light can be formed by a simple fabrication method. In comparison with the buried-heterostructure, the ridge structure has a merit that the fabrication cost can be lower.

The conventional optical semiconductor device having the ridge structure will be explained with reference to FIG. 11.

On a substrate 100, there are formed a lower clad layer 102, a lower light confinement layer 104, an active layer 106, an upper light confinement layer 108, an upper clad layer 110 and a contact layer 112 are formed. The contact layer 112 and the upper clad layer 110 are processed in a mesa stripe. The mesa stripe does not reach the upper light confinement layer 108. The mesa is formed down to a lower part of the upper clad layer 110 without arriving at the upper clad layer 110. A passivation film 114 is formed on the side surface of the mesa stripe and the upper surface of the clad layer 110. Electrodes 116, 118 are formed respectively on the backside of the substrate 10 and on the contact layer 112.

The related arts are disclosed in, e.g., Reference 1 (Japanese published unexamined patent application No. Hei 02-178989), Reference 2 (Japanese published unexamined patent application No. Hei 10-178200), Reference 3 (Japanese published unexamined patent application No. Hei 08-255932), and Reference 4 (Japanese published unexamined patent application No. 2001-127333).

To realize a direct modulation light source of low cost, the ridge structure is prospective as described above. However, the ridge structure has found it difficult to concurrently realize the parasitic capacitance decrease and the suppression of higher-order transverse mode oscillation.

In the optical semiconductor device of the ridge structure shown in FIG. 11, the width of the mesa stripe is set at about 2 μm, whereby the higher-order transverse oscillation can be suppressed. However, the parasitic capacitance is very large because of the p-i-n junction formed between the upper clad layer 110 and the lower clad layer 102 which is extended all over the element. Accordingly, the frequency band determined by a CR product of the device is so narrow that the high-speed modulation is made impossible.

In order to decrease the parasitic capacitance of the device, as shown in FIG. 12, it is effective to completely etch off the upper clad layer 110 to form a mesa stripe down to the upper light confinement layer 108. However, this structure makes the light confinement too strong, and the oscillation tends to take place in the higher-order transverse mode.

With the mesa stripe covered with an electrode material when the electrodes are formed, the leaked light is absorbed by the electrode material, and the oscillation threshold value often increases.

SUMMARY OF THE INVENTION

An object of the present invention is to provide an optical semiconductor device which can concurrently realize the decrease of the parasitic capacitance and the suppression of the vertical higher-order transverse mode oscillation, and a method for fabricating the same. Another object of the present invention is to provide an optical semiconductor device which can prevent the increase of the oscillation threshold value due to material of the electrode, and a method for fabricating the same.

According to one aspect of the present invention, there is provided an optical semiconductor device comprising: a lower clad layer formed over a semiconductor substrate; an optical waveguide layer formed over the lower clad layer and including an active layer for recombining carriers; an upper clad layer formed on the optical waveguide layer; and a contact layer formed on the upper clad layer, the upper clad layer having a mesa stripe configuration including a first mesa portion which is in contact with the contact layer and has a first width, and a second mesa portion which is in contact with the optical waveguide layer and has a second width larger than the first width, the first width, the second width and a thickness of the second mesa portion being set not to cause an oscillation of higher-order transverse mode.

According to another aspect of the present invention, there is provided a method for fabricating an optical semiconductor device comprising the steps of: forming a lower clad layer, an optical waveguide layer including an active layer for recombining carriers, an upper clad layer and a contact layer sequentially over a semiconductor substrate; etching the contact layer and the upper clad layer with a first striped etching mask as a mask until the upper clad layer is etched off to a prescribed film thickness, to thereby form a first mesa portion of a first width; and etching the upper clad layer with by using as a mask a second striped etching mask covering the first mesa portion until at least the optical waveguide layer is exposed, to thereby form a second mesa portion of a second width larger than the first width, the prescribed film thickness, the first width and the second width being set not to oscillate in higher-order transverse mode.

According to the present invention, the upper clad layer comprises a mesa stripe including a first mesa portion contacting the contact layer and a second mesa portion contacting the optical waveguide layer and having a width larger than the first mesa portion, whereby the area of the p-i-n junction, i.e., the parasitic capacitance of the device can be drastically decreased. Accordingly, the frequency band width can be increased. The width of the first mesa portion, the width of the second mesa portion and the thickness of the second mesa portion are suitably set, whereby the oscillation in the higher-order transverse mode can be suppressed.

The insulating film is buried on the side surface of the mesa stripe, or the electrode on the mesa stripe and the pad electrode are interconnected by the air-bridged structure, whereby the absorption of light leaked from the active layer by the electrode material and the resultant oscillation threshold value increase can be prevented.

DETAILED DESCRIPTION OF THE INVENTION

The optical semiconductor device and the method for fabricating the same according to one embodiment of the present invention will be explained with reference to FIGS. 1 to 10B.

Figure 1A:
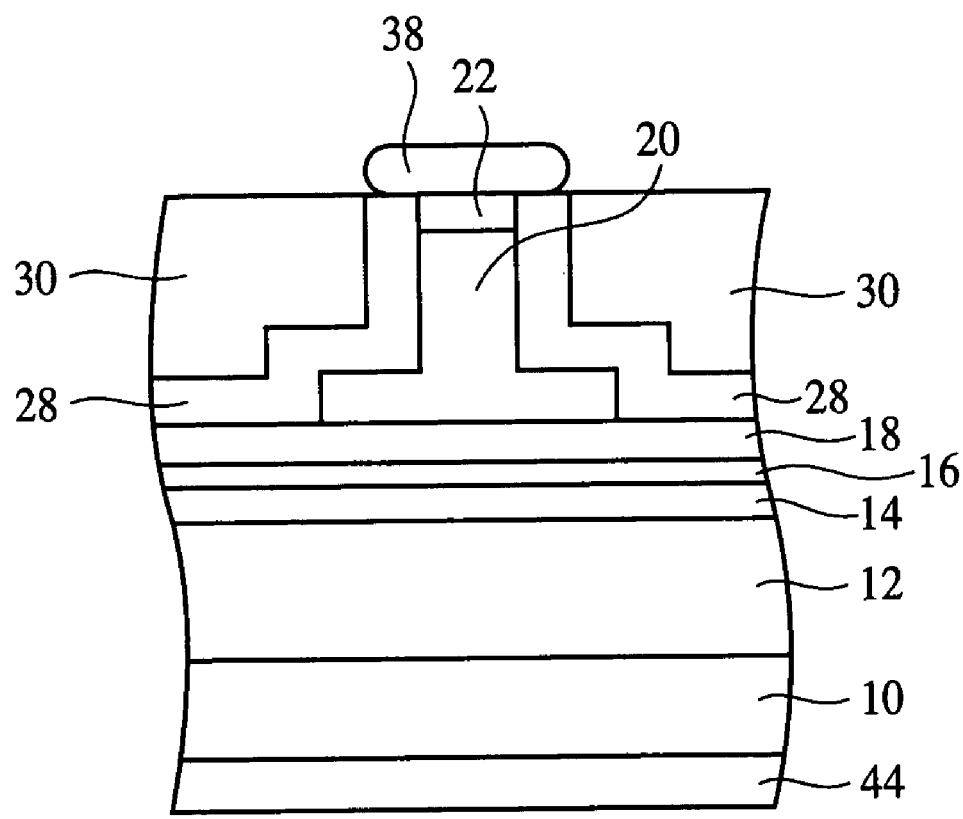
FIGS. 1A and 1B are diagrammatic sectional views of the optical semiconductor device according to one embodiment of the present invention, which show a structure thereof.
Figure 1B:
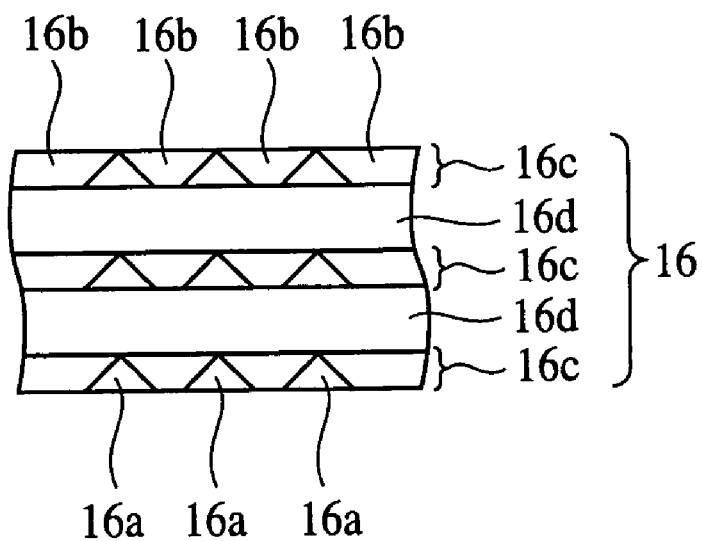
Figure 2A:
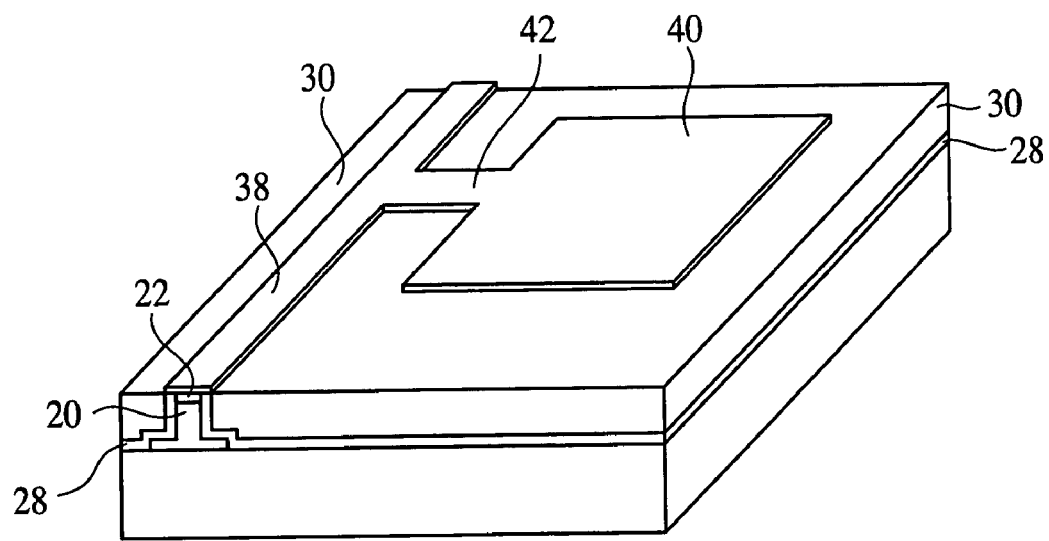
FIGS. 2A and 2B are perspective views of the optical semiconductor device according to the embodiment of the present invention, which show the structure thereof.
Figure 2B:
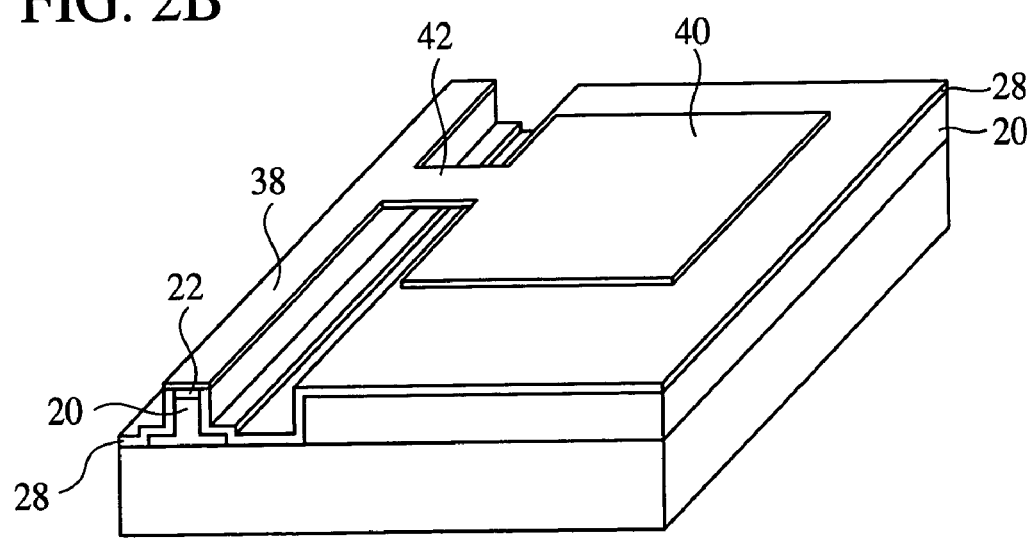
Figure 3:
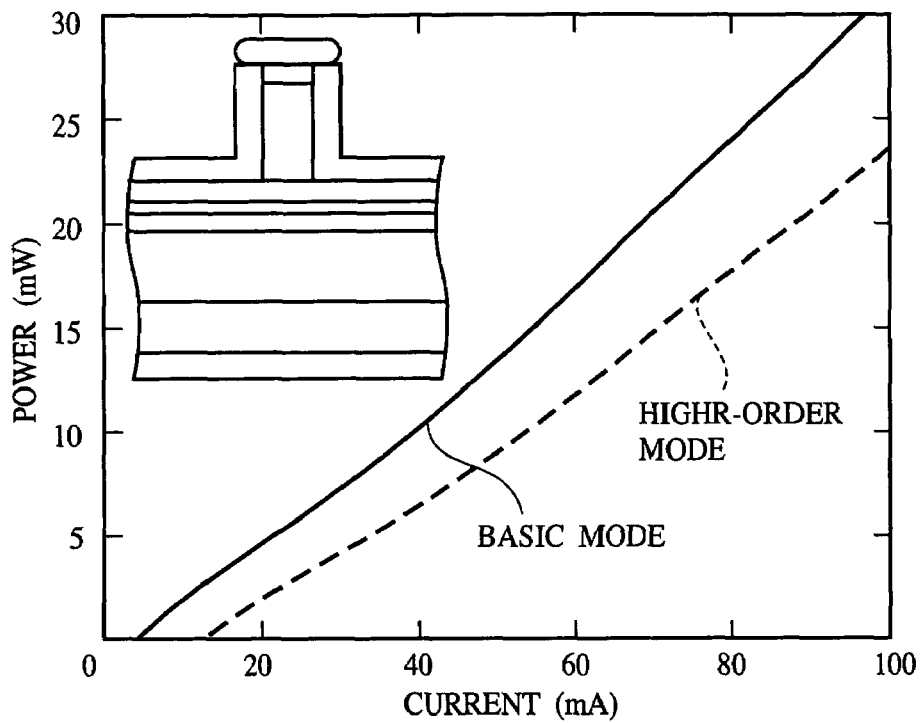
FIG. 3 is a graph of the result of the current-optical output characteristics of the conventional optical semiconductor device given by a simulation.
Figure 4:
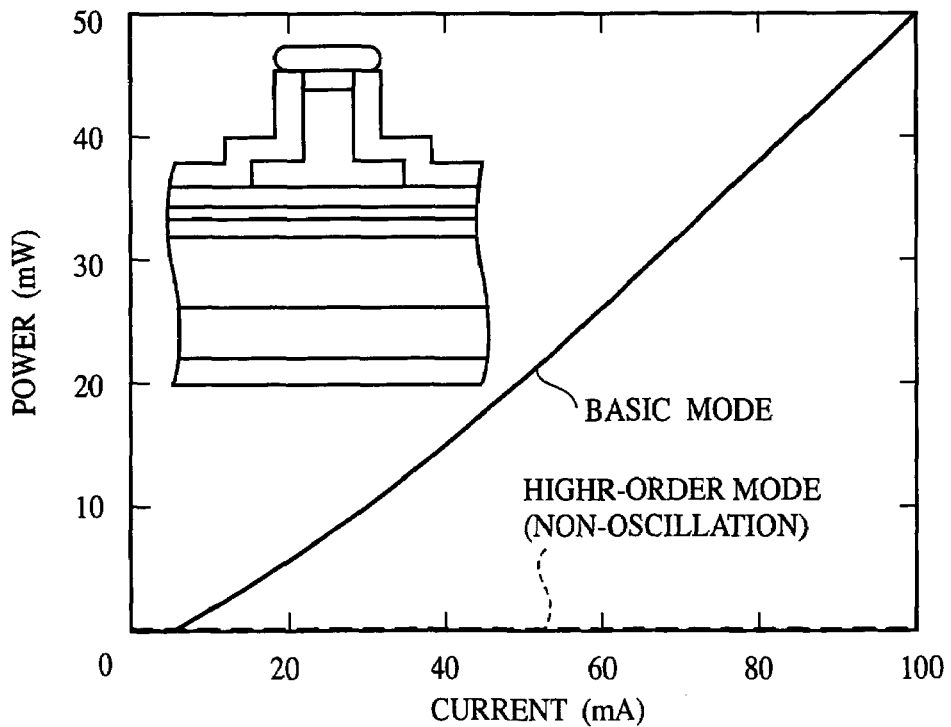
FIG. 4 is a graph of the result of the current-optical output characteristics of the optical semiconductor device according to the embodiment of the present invention given by a simulation.
Figure 5:
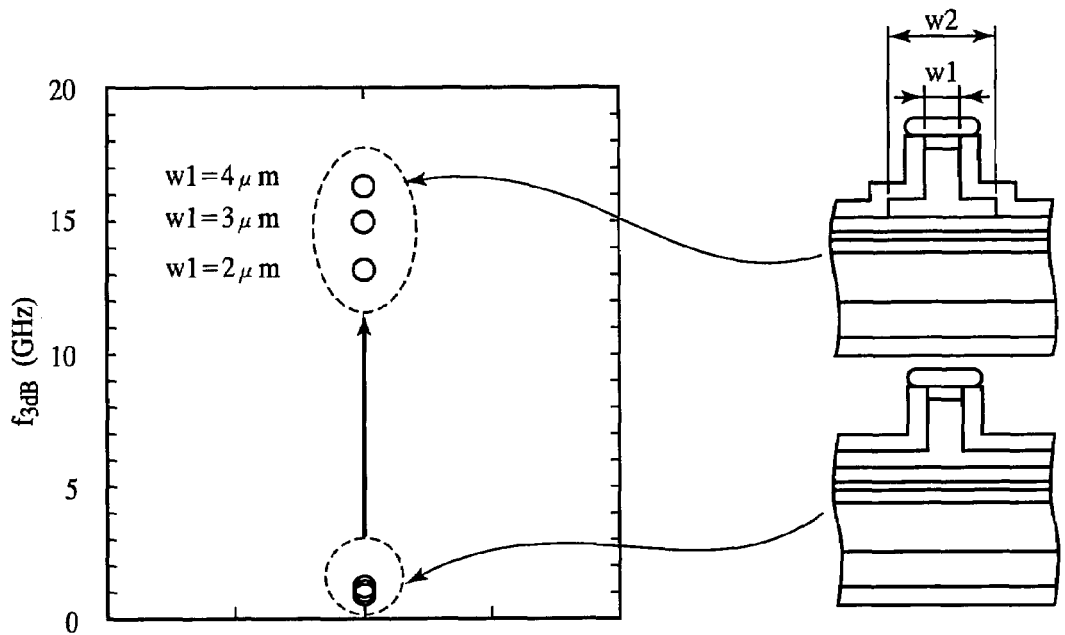
FIG. 5 is a graph of the relationships between the configuration of the upper clad layer and the 3 dB frequency band width.
Figure 6:
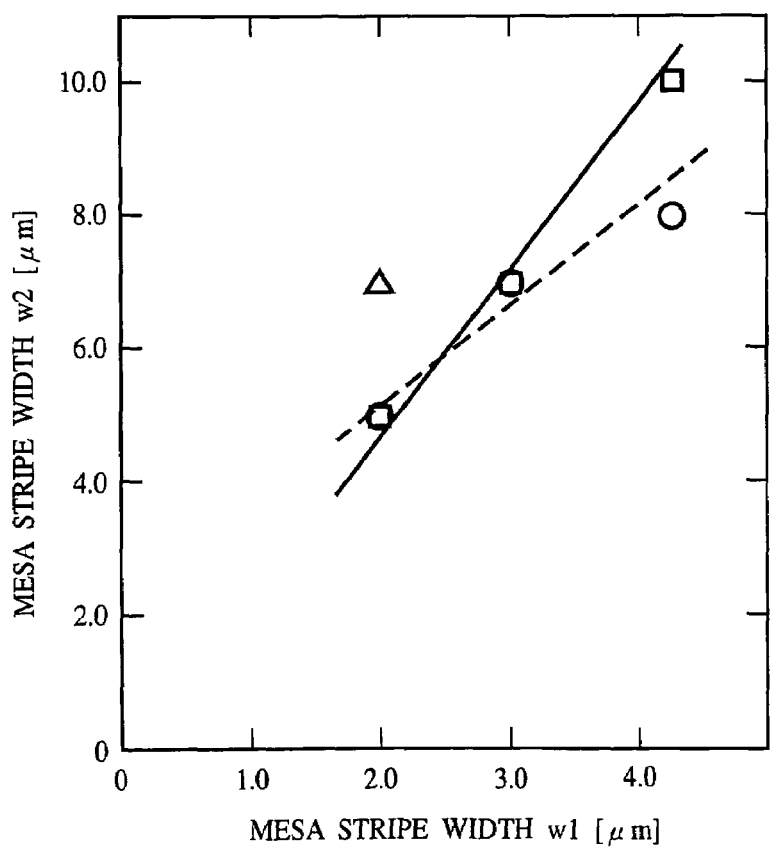
FIG. 6 is a graph of the relationships between the width of a mesa stripe and the oscillation conditions of the higher-order transverse mode.
Figure 7:
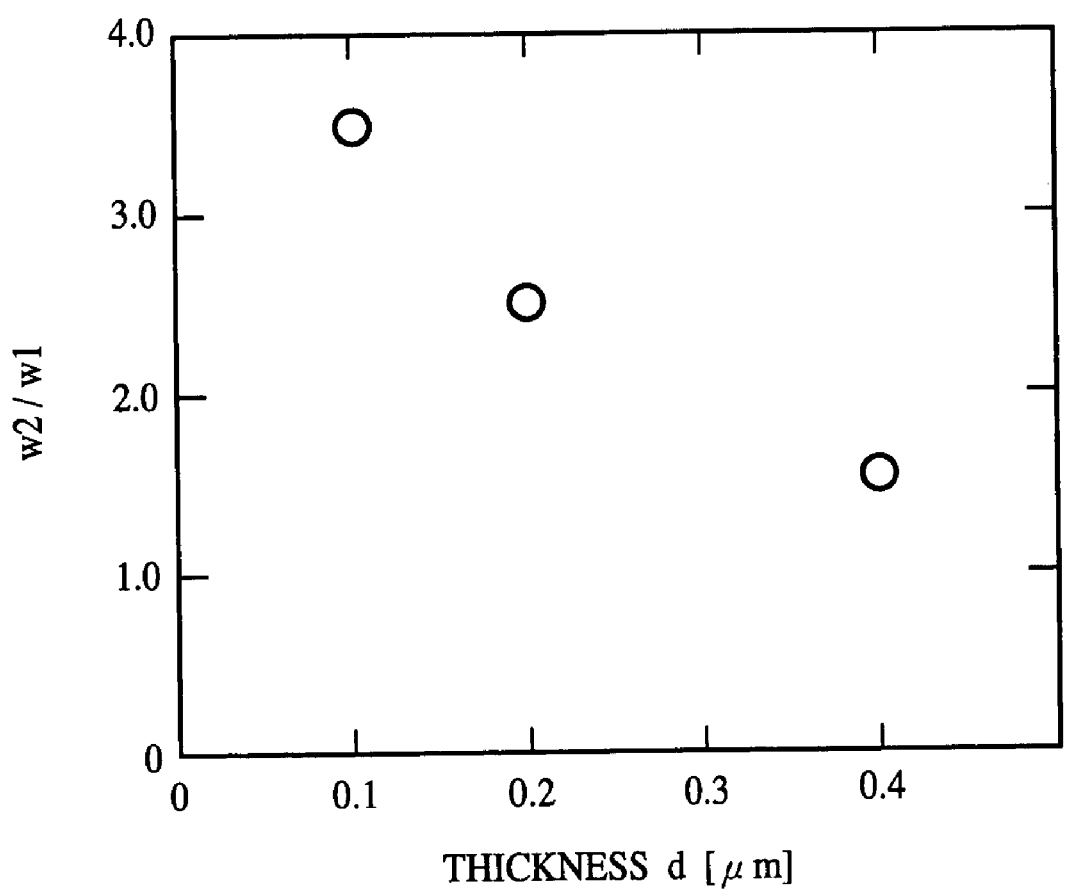
FIG. 7 is a graph of the relationships between the mesa stripe configuration and oscillation conditions for the higher-order transverse mode.

FIGS. 1A and 1B are diagrammatic sectional views of the optical semiconductor device according to the present embodiment, which show a structure thereof. FIGS. 2A and 2B are perspective views of the optical semiconductor device according to the present embodiment, which show the structure thereof. FIGS. 3 and 4 are graphs of the result of the current-optical output characteristics of lasers by simulation. FIG. 5 is a graph of the relationships between the configuration of the upper clad layer and the 3 dB frequency band width. FIG. 6 is a graph of the relationships between the width of a mesa stripe and the oscillation conditions of the higher-order transverse mode. FIG. 7 is a graph of the relationships between the mesa stripe configuration and the oscillation conditions for the higher-order transverse mode. FIGS. 8A to 10B are sectional views of the optical semiconductor device according to the present embodiment in the steps of the method for fabricating the same, which show the method.

First, the structure of the optical semiconductor device according to the present embodiment will be explained with reference to FIGS. 1A and 1B.

As shown in FIG. 1A, on a substrate 10 of n-GaAs, there are formed a lower clad layer 12 of n-$Al_{0.4}Ga_{0.6}As$, a lower light confinement layer 14 of undoped GaAs, an active layer 16, an upper light confinement layer 18 of undoped GaAs, an upper clad layer 20 of p-$Al_{0.4}Ga_{0.6}As$ and a contact layer 22 of p-GaAs.

As exemplified in FIG. 1B, the active layer 16 is a quantum dot active layer including plural quantum dot layers 16c each having InAs quantum dots 16a buried in an $In_{0.17}Ga_{0.83}As$ layer 16b, which are laid one on another with a spacer layer 16d of undoped GaAs formed therebetween.

The upper clad layer 20 and the contact layer 22 are processed in a mesa stripe. The upper clad layer 20 is wider at the part where the upper clad layer 20 in contact with the upper light confinement layer 18 than the part where the upper clad layer 20 is in contact with the contact layer 22. The upper clad layer 20 is not formed on the entire surface of the upper light confinement layer 18. That is, the upper clad layer 20 has a mesa stripe including a first mesa portion which is in contact with the contact layer 22 and a second mesa portion which is in contact with the upper light confinement layer 18 and is wider than the first mesa portion.

A passivation film 28 of a material having a lower refractive index than the upper clad layer 20 is formed on the side surface of the mesa stripe. An insulating film 30 is buried on the passivation film 28. A p-type electrode 38 is formed on the contact layer 22. An n-type electrode 44 is formed on the backside of the substrate 10.

As shown in FIG. 2A, the p-type electrode 38 is connected to a pad electrode 40 via a lead-out electrode 42. The pad electrode 40 is an electrode for the wire bonding. The insulating film 30, which is formed of a material of a dielectric constant lower than that of the passivation film 28, is buried on the side surface of the mesa stripe. The lead-out electrode 42 and the pad electrode 40 are formed on the insulating film 30.

As described above, one characteristic of the optical semiconductor device according to the present embodiment is that the upper clad layer 20 has a mesa stripe including a first mesa portion which is in contact with the contact layer 22 and a second mesa portion which is in contact with the upper light confinement layer 18 and is wider than the first mesa portion. The reason for forming the upper clad layer 20 in this configuration will be explained below.

Figure 11:
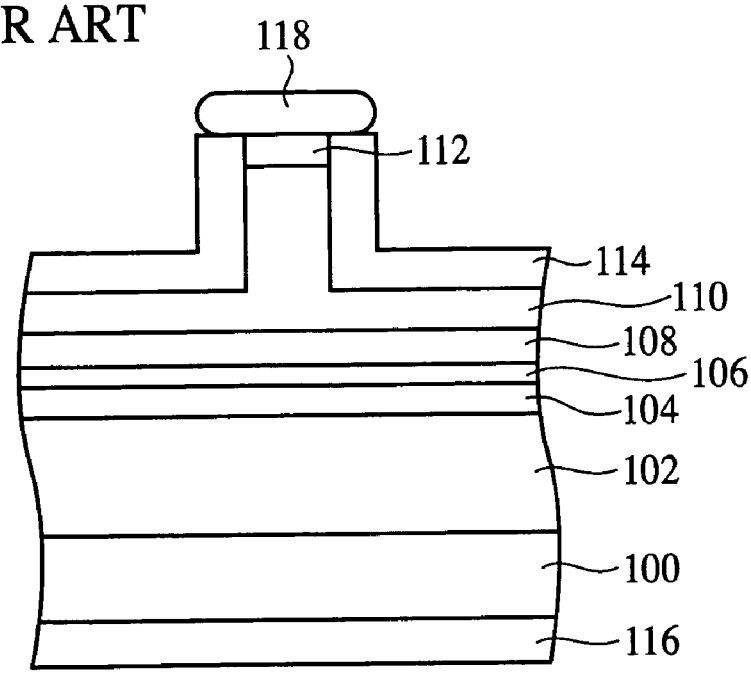
FIG. 11 is a diagrammatic sectional view of the conventional optical semiconductor device, which shows the structure thereof.

The upper clad layer 20 is formed in the mesa stripe which arrives at the upper light confinement layer 18, whereby the p-I-n junction is present only at the part where the mesa stripe is present. Accordingly, in comparison with the optical semiconductor device as shown in FIG. 11, in which the upper clad layer 20 is present all on the part which is in contact with the upper light confinement layer 18, the optical semiconductor device according to the present embodiment can much decrease the parasitic capacitance of the device.

Figure 12:
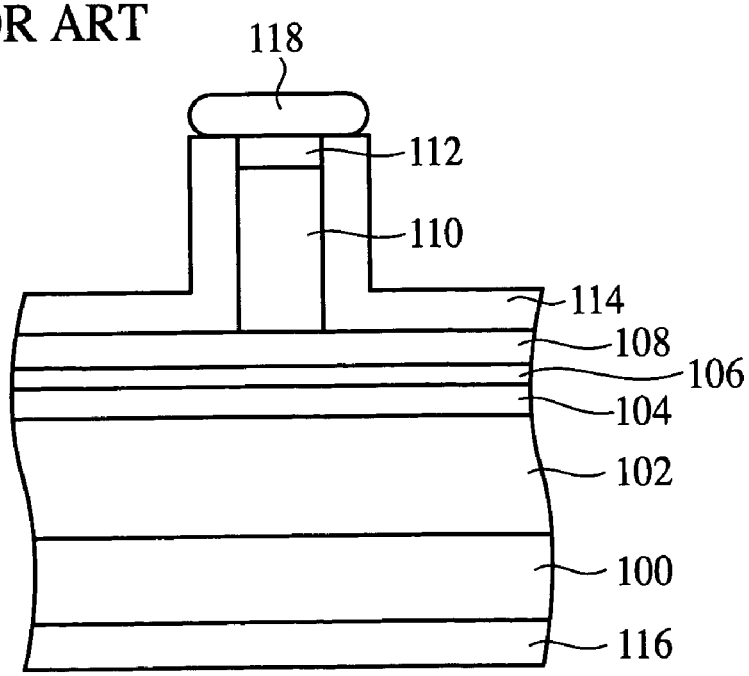
FIG. 12 is a diagrammatic sectional view of another conventional optical semiconductor device, which shows the structure thereof.

The width of the second mesa portion (the width of the part where the upper clad layer 20 is in contact with the light confinement layer 18) of the upper clad layer 20 is made larger than the width of the first mesa portion (the width of the part where the upper clad layer 20 is in contact with the contact layer 22), whereby the light confinement is made weak in comparison with that of the conventional optical semiconductor device, which has the mesa stripe of a uniform width as shown in FIG. 12. Thus, the generation of the higher-order transverse mode can be suppressed.

FIG. 3 is a graph of the current-optical output characteristics of a laser including the upper clad layer 20 having a mesa stripe configuration of a uniform width arriving at the upper light confinement layer 18 (the conventional configuration shown in FIG. 12), which was given by simulation. The width of the mesa stripe was 4 µm. FIG. 4 is a graph of the current-optical output characteristics of a laser including the upper clad layer 20 of a mesa stripe configuration having the first mesa portion which is in contact with the contact layer and a second mesa portion which is in contact with the upper light confinement layer, the second mesa portion being wider than the first mesa portion (the configuration of the present invention), which was given by simulation. The width of the mesa stripe was 10 μm at the part where the upper clad layer 20 is in contact with the upper light confinement layer and 4 μm at the part where the upper clad layer 20 is in contact with the contact layer 22.

In the laser with the mesa stripe of a uniform width, as shown in FIG. 3, it is found that after the basic mode has oscillated, the higher-order mode oscillates. In contrast to this, in the laser with the mesa stripe having a larger width at the part which is in contact with the upper light confinement layer 18 than a width at the part which is in contact with the contact layer 22, as shown in FIG. 4, the basic mode alone oscillates.

FIG. 5 is a graph of the 3 dB frequency band width of the laser having a mesa stripe configuration including the first mesa portion which is in contact with the contact laser and the second mesa portion which is in contact with the upper light confinement layer, the second mesa portion being wider than the first mesa portion, and the 3 dB frequency band width of the laser having the upper clad layer 20 left on all the surface of the part which is in contact with the upper light confinement layer 18. In the mesa stripe configuration arriving at the upper light confinement layer 18, the width w2 of the part of the upper clad layer 20, which is in contact with the upper light confinement layer 18 was constantly 10 μm, and the width w1 of the part of the upper clad layer 20, which is in contact with the contact layer 22 was 2 μm, 3 μm and 4 μm. In the mesa stripe configuration having the upper clad layer 20 left on the entire surface, the width w1 of the part which is in contact with the contact layer 22 was 2 μm, 3 μm and 4 μm.

As shown in FIG. 5, in the mesa stripe having the upper clad layer 20 left on all the surface of the part which is in contact with the upper light confinement layer 18, the 3 dB frequency band width was about 1 GHz, and in the mesa stripe including the first mesa portion which is in contact with the contact layer and the second mesa portion which is in contact with the upper light confinement layer, the width of the second mesa portion being larger than the width of the first mesa portion, for the width w1 of 2 μm, the dB frequency band width was about 13 GHz; for the width w1 of 4 μm, the dB frequency band width was about 16.5 GHz, which are very wide frequency band width.

Of parameters defining a configuration of the mesa stripe, those that are closely related to the oscillation of the higher-order transverse mode are mainly the width w1 of the part which is in contact with the contact layer 22, the width w2 of the part which is in contact with the upper light confinement layer 18 and the thickness d of the part which is in contact with the upper light confinement layer 18.

The inventor of the present application made earnest studies of the relationships with these parameters and has found that when the thickness d is 0.4 μm, in order to prevent the oscillation of the higher-order transverse mode, it is necessary that the width w2 must be not less than 5 μm for the width w1 of 2 μm, the width w2 must be not less than 7 μm for the width w1 of 3 μm, and the width w2 must be not less than 8 μm for the width w1 of 4 μm.

When the thickness d is as thin as 0.2 μm, in order to prevent the oscillation of the higher-order transverse mode, it is necessary that the width w2 must be not less than 5 μm for the width w1 of 2 μm, the width w2 must be not less than 7 μm for the width w1 of 3 μm, and the width w2 must be not less than 10 μm for the width w1 of 4 μm.

When the thickness d is further as thin as 0.1 μm, in order to prevent the oscillation of the higher-order transverse mode, it is necessary that the width w2 must be above 7 μm for the width w1 of 2 μm. With the width w1 of not less than 3 μm, the oscillation of the higher-order transverse mode cannot be suppressed.

The above-described relationships are graphed as in FIG. 6. In FIG. 6, the Δ marks indicate the case with the thickness d of 0.1 μm, the ○ marks indicate the case with the thickness d of 0.2 μm, and the □ marks indicate the case with the thickness d of 0.4 μm.

When these plots are regressed linearly, the region upper left of the regression line is the region where the oscillation of the higher-order transverse mode does not take place, and the region lower right of the regression line is the region where the oscillation of the higher-order transverse mode takes place. The slope of the regression line (w2/w1) with the thickness d of 0.2 μm is about 2.5, and the slope of the regression line (w2/w1) with the thickness d of 0.4 μm is about 1.5.

When the relationship between the ratio of the width w2 to the width w1 (w2/w1) and the thickness d is graphed based on these results, the graph as shown in FIG. 7 is given. When the plots in FIG. 7 are regressed linearly, the region of the upper right of the regression line is the region where the oscillation of the higher-order transverse mode does not take place, and the region lower left of the regression line is the region where the oscillation of the higher-order transverse mode takes place. The equation of the regression line at this time is as follows.

$$(w2/w1) = -6.4\,d + 4$$

Accordingly, the higher-order transverse mode will be suppressed by setting the width w1 [μm], the width w2 [μm] and the thickness d [μm] to satisfy the relationship:

$$(w2/w1) > -6.4\,d + 4$$

so that the relationship is positioned in the region upper right of the regression line in the graph of FIG. 7.

As described above, the parameter defining the mesa configuration influence one another, and it is difficult to define the respective parameters separately. In order to prevent the oscillation of the higher-order transverse mode, it is necessary to suitably set these parameters in consideration of their relationship. The width w2 is more effective to suppress the oscillation of the higher-order transverse mode as it is larger, but as the width w2 is larger, the parasitic capacitance is increased. Accordingly, it is preferable to suitably set the upper limit of the width w2 in accordance with a required frequency band width.

The optical semiconductor device according to the present invention is characterized also in that, as shown in FIG. 2A, the insulating film 30 is buried on the side surface of the mesa stripe, and the lead-out electrode 42 connected to the p-type electrode 38 and the pad electrode 40 are formed on the insulating film 30. The p-type electrode 38 and the pad electrode 40 are interconnected with such lead-out electrode 42, whereby the side surface of the mesa stripe is not covered with the electrode material. Thus, the absorption of the light leaked from the active layer 16 by the electrode material and the resultant oscillation threshold value increase can be prevented.

Otherwise, as shown in FIG. 2B, the air-bridge structure in which a void is formed between the passivation film 28 and the lead-out electrode 42 may be used. In the air-bridged structure as well, the side surface of the mesa stripe is not covered with the electrode material, whereby the absorption of the light leaked from the active layer 16 by the electrode material and the resultant oscillation threshold value increase can be prevented.

Next, the method for fabricating the optical semiconductor device according to the present embodiment will be explained with reference to FIGS. 8A to 10B. In the following description, the present invention is applied to one example of 1.3 μm-band quantum dot lasers.

Figure 8A:
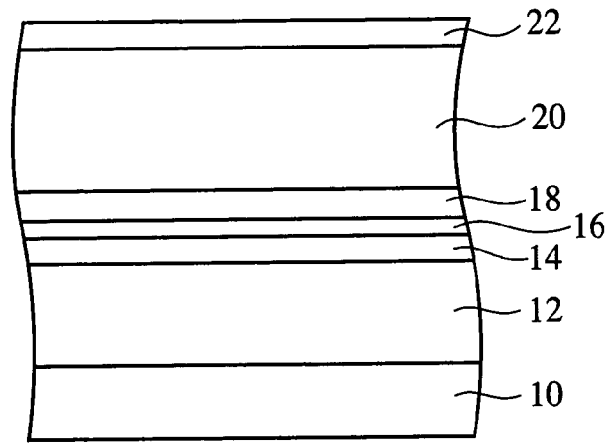
FIGS. 8A-8C, 9A-9B and 10A-10B are sectional views of the optical semiconductor device according to the embodiment of the present invention in the steps of the method for fabricating the same, which show the method.

First, on a substrate 10 of, e.g., n-GaAs (Si: $1 \times 10^{18}$ cm$^{-3}$), the lower clad layer 12 of, e.g., a 1.4 μm thick n-Al$_{0.4}$Ga$_{0.6}$As (Si: $1 \times 10^{18}$ cm$^{-3}$), the lower light confinement layer 14 of, e.g., a 114 nm-thick undoped GaAs, the active layer 16, the upper light confinement layer 18 of, e.g., 114 nm-thick undoped GaAs, the upper clad layer 20 of, e.g., a 1.4 μm-thick p-Al$_{0.4}$Ga$_{0.6}$As (Be: $1 \times 10^{18}$ cm$^{-3}$) and the contact layer 22 of, e.g., a 0.4 μm-thick p-GaAs (Be: $1 \times 10^{19}$ cm$^{-3}$) are grown (FIG. 8A) by, e.g., MBE method (FIG. 8A).

As exemplified in FIG. 1B, the active layer 16 is formed by 3 quantum dot layers 16c each formed of the quantum dots 16a of InAs buried in, e.g., the In$_{0.17}$Ga$_{0.83}$As layer, which are laid one on another with the spacer layer 16d of, e.g., a 30 nm-thick undoped GaAs formed therebetween.

Next, a 300 nm-thick SiO$_2$ film, for example, is deposited on the entire surface by, e.g., CVD method.

Then, the SiO$_2$ film is patterned by photolithography and wet etching to form a 6 μm-width striped etching mask 24 of the SiO$_2$ film.

Figure 8B:
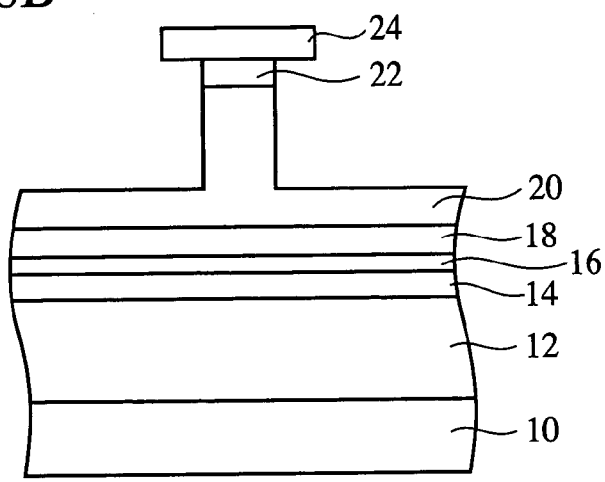

Next, with the etching mask 24 as the mask, the contact layer 22 and the upper clad layer 20 are etching by wet etching using a phosphoric acid-based etchant. At this time, the etching is stopped not to remove the upper clad layer 20 down to the upper surface of the upper light confinement layer 18 but to leave the upper clad layer 10 in an about 0.2 μm-thick. The first mesa portion is thus formed. The etching goes on also transversely, and the final width of the etched mesa is about 4 μm (FIG. 8B).

Next, the etching mask 24 is removed by wet etching using, e.g., a hydrofluoric acid-based aqueous solution.

Then, a 300 nm-thick SiO$_2$ film, for example, is deposited on the entire surface by, e.g., CVD method.

Then, the SiO$_2$ film is patterned by photolithography and wet etching to form a 10 μm-width striped etching mask 26 of the SiO$_2$ film. The first mesa portion formed by using the etching mask 24 is covered by the etching mask 26.

Figure 8C:
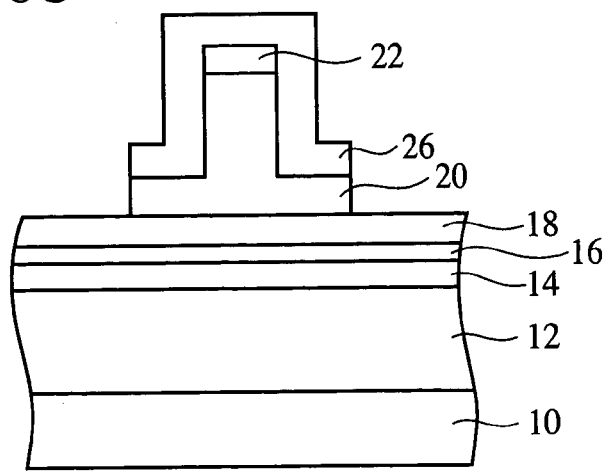

Next, with the etching mask 26 as the mask, the clad layer 20 in the region where the clad layer 20 is not covered with the etching mask 26 is completely removed by wet etching using a phosphoric acid-based etchant (FIG. 8C). Thus, the second mesa portion is formed. The upper light confinement layer 18 may be etched, without any problem.

Next, the etching mask 26 is removed by wet etching using, e.g., a hydrofluoric acid-based aqueous solution.

Then, a 500 nm-thick SiO$_2$ film, for example, is deposited on the entire surface by, e.g., CVD method to form the passivation film 28 of the SiO$_2$ film.

Figure 9A:
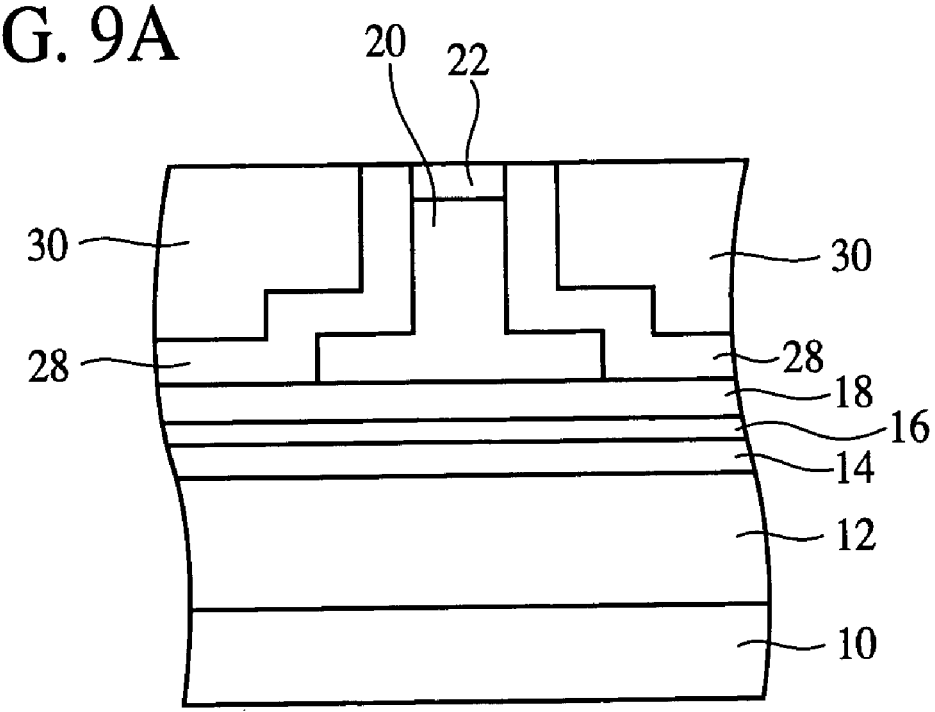

Next, polyimide, for example, is applied by spin coating and then ashed to expose the top of the mesa stripe to thereby form the insulating film 30 of the polyimide on both sides of the mesa stripe (FIG. 9A). In place of polyimide, a hard baked resist film may be formed.

Next, the passivation film 28 is patterned by photolithography and wet etching to expose the contact layer 22 on the mesa stripe.

Then, the electrode 32 of AuZn is formed by, e.g., vacuum evaporation method on the contact layer 22 exposed on the mesa stripe.

Next, a Pt/Ti film 34 is formed on the entire surface by, e.g., vacuum evaporation method.

Figure 9B:
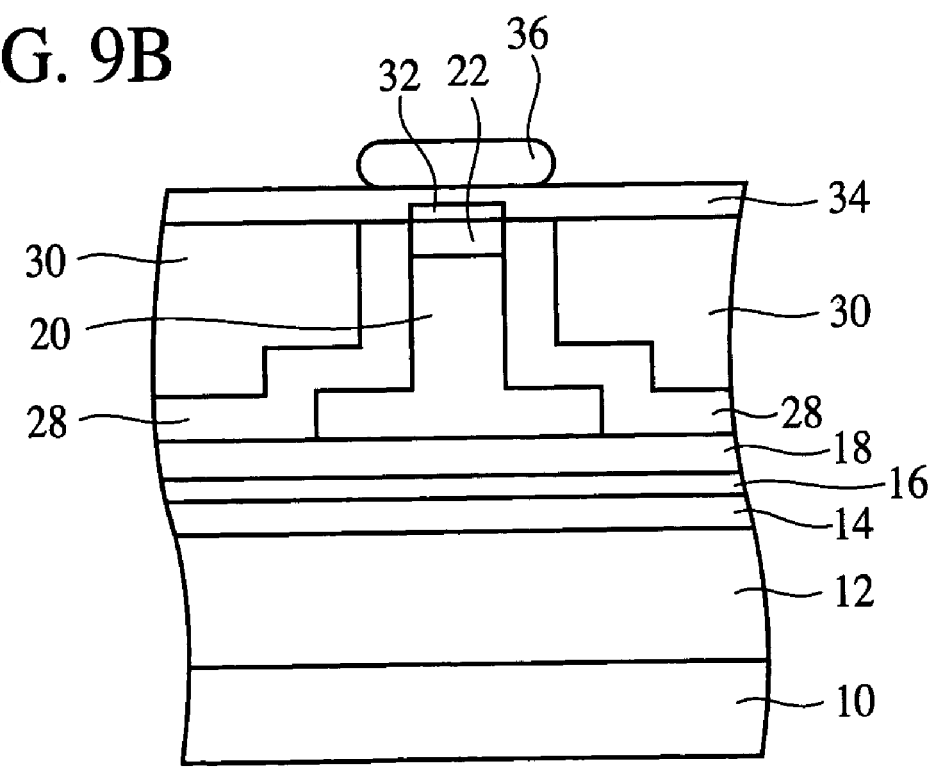

Then, an Au film 36 is formed on the mesa stripe and the Pt/Ti film 34 in the region for the pad electrode forming region by plating (FIG. 9B).

Figure 10A:
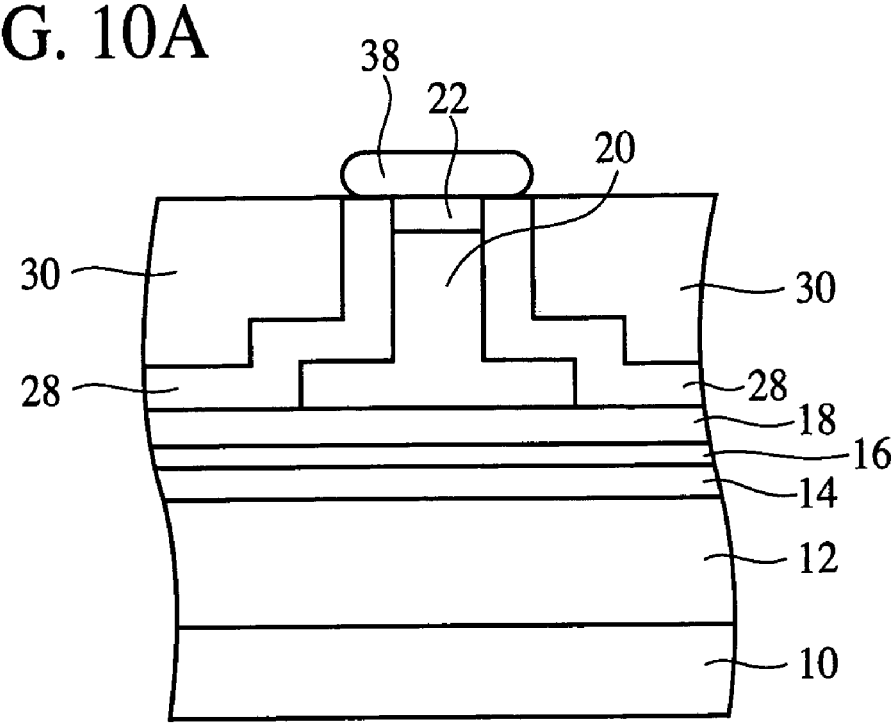

Then, the Pt—Ti film 34 in the region where the Au film 36 has not been formed is removed to form the p-type electrode 38 of the AuZn electrode 32, the Pt/Ti film 34 and the Au film 36 on the mesa stripe and in the region for the pad electrode to be formed in (FIG. 10A).

Thus, the lead-out electrode 42 interconnecting the p-type electrode 38 on the mesa stripe and the pad electrode 40 is formed on the insulating film 30 (FIG. 2A). The side surface of the mesa stripe is not covered with the electrode material, so that the absorption of the leaked light by the electrode material and the oscillation threshold value increase can be prevented.

When the insulating film 30 is formed of a material which can be selectively removable in a later step, such as a hard backed resist, the insulating film 30 may be removed. Thus, the air-bridge structure in which a void is formed immediately below the lead-out electrode 42 interconnecting the mesa stripe and the pad electrode 40 can be formed (FIG. 2B). In this case, the upper clad layer 20, or the upper clad layer 20 and the contact layer 22 is left in the pad region. In the air-bridge structure as well, the side surface of the striped mesa are not covered with the electrode material, whereby the absorption of the leaked light by the electrode material and the resultant oscillation threshold value increase can be prevented.

Next, the backside of the substrate 10 is polished to decrease the thickness of the substrate to, e.g., 100 μm.

Figure 10B:
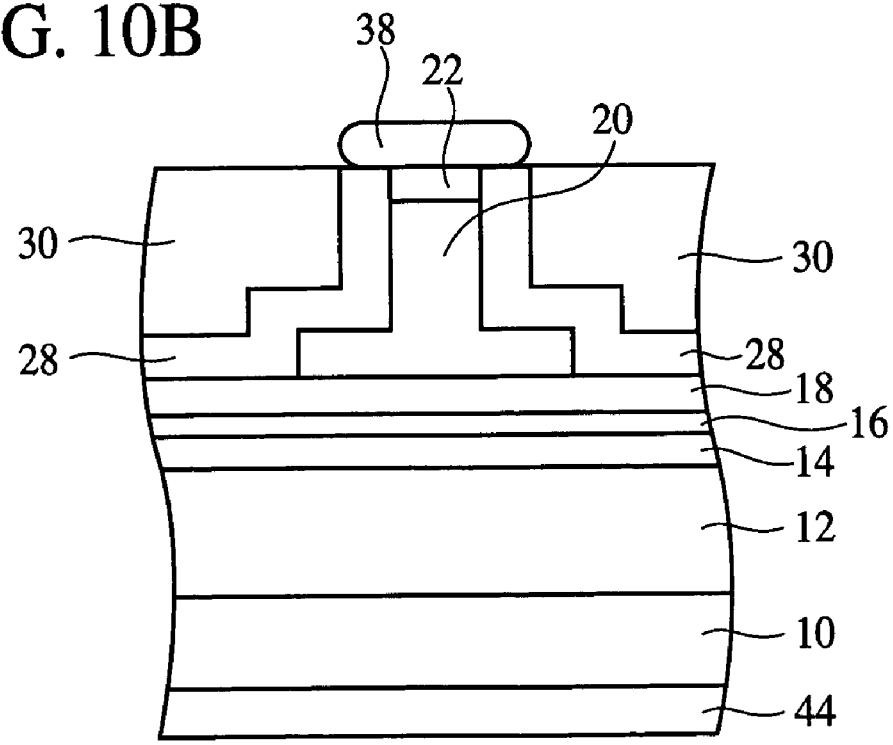

Then, on the polished surface of the substrate 10, an Au/AuGe film is deposited by vacuum evaporation method, and then an Au film is deposited by plating to form the n-type electrode 44 of the Au/Au/AuGe film (FIG. 10B).

Then, the substrate 10 cleaved, and the device is completed.

As described above, according to the present embodiment, the upper clad layer 20 is formed of the mesa stripe including the first mesa portion which is in contact with the contact layer 22, and the second mesa portion which is in contact with the upper light confinement layer 18 and has a larger width than the first mesa portion, whereby the area of the p-i-n junction, i.e., the parasitic capacitance of the device can be drastically decreased. Thus, the frequency band width can be increased. The width of the first mesa portion, the width of the second mesa portion and the thickness of the second mesa portion are suitably set to thereby suppress the oscillation of the higher-order transverse mode.

The insulating film is buried on the side surface of the mesa stripe, or the electrode on the mesa stripe and the pad electrode are interconnected by the air-bridge structure, whereby the absorption of the light leaked from the active layer by the electrode material and the resultant oscillation threshold value increase can be prevented.

Modified Embodiments

The present invention is not limited to the above-described embodiment and can cover other various modifications.

For example, in the above-described embodiment, the present invention is explained by means of an example of a 1.3 μm-band quantum dot laser, but the present invention is applicable to any other optical semiconductor device. For example, in the above-described embodiment, the structure having the quantum dot active layer sandwiched by the light confinement layers is used, but any other structure may be used as long as the optical waveguide layer includes an active layer for recombining the carriers.

The active layer may be formed of, other than the quantum dot active layer, a bulk active layer, a quantum well active layer, a quantum wire active layer or others. When a quantum well active layer is used, the active layer may be formed of a quantum well layer and barrier layers. When a quantum wire active layer or a quantum dot active layer is used, the active layer may be formed of the quantum wires or the quantum dots, and spacer layers.

As a material group forming the device, other than the above-described AlGaAs/GaAs group, the InGaAsP/InP group or others may be used.

In the above-described embodiment, the side surface of the mesa stripe is vertical but is not essentially vertical. The side surface of the mesa stripe may be tapered. Otherwise, 2-step mesa stripe including a width of the part contacting the upper light confinement layer and a width of the part contacting the contact layer discontinuously changed makes the same effect as in the above-described embodiment.

In the above-described embodiment, the upper clad layer is a 2-step mesa stripe having the width of the part contacting the upper light confinement layer larger than the width of the part contacting the contact layer. However, the upper clad layer may be formed in a 3-step or more-step mesa stripe configuration.

In the above-described embodiment, the mesa stripe arrives at the upper light confinement layer, but a mesa stripe arriving at the lower clad layer may be formed.

What is claimed is:

1. An optical semiconductor device comprising:
   a lower clad layer formed over a semiconductor substrate;
   an optical waveguide layer formed over the lower clad layer and including an active layer for recombining carriers;
   an upper clad layer formed on the optical waveguide layer; and
   a contact layer formed on the upper clad layer,
   the upper clad layer having a mesa stripe configuration including a first mesa portion which is in contact with the contact layer and has a first width and a second mesa portion which is in contact with the first mesa portion and the optical waveguide layer and has a second width larger than the first width and smaller than a width of the optical waveguide layer, a width of the first mesa portion at a contact between the first mesa portion and the second mesa portion and a width of the second mesa portion at the contact being different from each other, the first width, the second width and a thickness of the second mesa portion being set not to cause an oscillation of higher-order transverse mode.

2. An optical semiconductor device according to claim 1, further comprising:
   an insulating film formed burying the side surface of the upper clad layer;
   a stripe-shaped electrode formed on the contact layer; and
   a lead-out electrode and a pad electrode electrically connected to the stripe-shaped electrode and a pad electrode which are formed on the insulating film.

3. An optical semiconductor device according to claim 1, further comprising:
   a passivation film formed on the side surface of the upper clad layer;
   stripe-shaped electrode formed on the contact layer; and
   a lead-out electrode and a pad electrode electrically connected to the striped-shaped electrode, and in which a void is formed between the passivation film and the lead-out electrode.

4. An optical semiconductor device according to claim 1, wherein
   the optical waveguide layer includes a lower optical confinement layer, the active layer formed on the lower optical confinement layer and an upper light confinement layer formed on the active layer.

5. An optical semiconductor device according to claim 1, wherein the active layer includes quantum dots or quantum wires and spacer layers.

6. An optical semiconductor device according to claim 1, wherein the active layer includes a quantum well and barrier layers.

7. An optical semiconductor device according to claim 1, wherein
   the active layer is a bulk active layer.

* * * * *